TERMINAL PIN FOR PRINTED CIRCUIT BOARD

Filed June 21, 1956

INVENTOR.
Ronald S. Narozny,
BY
Wilkinson, Huxley, Byron & Hume
Attys.

United States Patent Office 2,811,702

Patented Oct. 29, 1957

2,811,702

TERMINAL PIN FOR PRINTED CIRCUIT BOARD

Ronald S. Narozny, Chicago, Ill., assignor to Malco Tool & Mfg. Co., Chicago, Ill., a partnership consisting of Al Just and Margaret R. Just Application June 21, 1956, Serial No. 592,895

4 Claims. (Cl. 339—220)

This invention relates to terminal pins that are mounted by insertion into a base board of a printed circuit and the like and which project from the base board to serve as electrical terminal elements to which wire leads may be attached.

The particular terminal pin herein disclosed is especially suited to electronic or electrical assemblies of printed circuits wherein certain conductive paths are provided by conducting material attached to an insulating board in a pattern suited to the particular purpose of the circuit, and requiring connection of separate wiring leads at certain points with the conductive material on the board. When making such connections, a hole is provided in the base board at each point at which a terminal pin connection is to be made, and one of the pins is inserted therein. The pin is so constructed that when the board, with the mounted pins, is dipped into molten solder, the attachment of the pins to the board becomes rigid, due to the formation of a solder joint between the pin and the connective material on the board about the hole.

One of the necessary requirements of a pin herein disclosed is that it be readily usable in automatic equipment which will dispense the pin and mount it in the base board of a printed circuit. This means that the pin must be capable of ready insertion into the mounting board and also must be held to the board with reasonable security after it is so mounted and then capable of being rendered completely secure and rigid in the board.

One variety of pins in the past has attached the wiring leads thereto by insertion of the lead into a hole in the pin. The terminal pin of the present invention is concerned with providing a terminal element to which the wiring lead may be fastened by a wrapping operation rather than connection in a hole or aperture.

It is, therefore, an object of the present invention to provide a terminal pin which can be used in the base board of a printed circuit and the like.

It is a further object of the invention to provide a terminal pin that may be readily inserted and securely held in a base board.

It is a yet further object of the invention to provide a terminal pin adapted to be dispensed and mounted in a baseboard by an automatic dispensing machine.

It is another object of the invention to provide a terminal pin that is readily and inexpensively manufactured.

Further objects and advantages of this invention will become evident as the description proceeds and from an examination of the accompanying drawing which illustrates one embodiment of the invention and in which similar numerals refer to similar parts throughout the several views.

Figure 5:
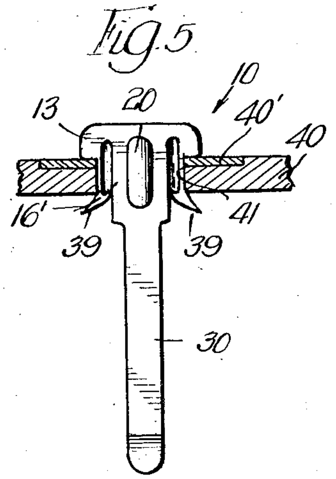
Figure 5 is a view in section of a base board of a printed circuit illustrating how a terminal pin of the present invention is mounted therein and showing the disposition of the pin after a staking operation.

Referring now to the drawings, the terminal pins of the invention are referred to by numeral 10. Each of the pins is provided with a head 11 which in cross section is elongated and of a relatively long length and narrow width. Referring now to Figures 2 through 5, the terminal pin is shown severed from the chain and when so severed in an automatic dispensing machine, falls with the pin portion 30 pointed downwardly to an opening in the base board as shown in Figure 5. At the top of the head 11 of the terminal pin is integrally formed a pair of flanges 13 which project outwardly from the ends thereof. When mounted the flanges are adapted to engage the surface of the base board adjacent the openings.

The bottom of the head 11 has an integrally formed portion 16 which projects below the base board when the pin is mounted therein and is adapted to be staked or spread at the marginal portions to form a second pair of flanges below the base board, as shown in Figure 5, which together with the flanges above the base board firmly secure the terminal pin thereto.

The sides of the head 11 are provided with embossed portions 20, 21 adapted to engage the sides of the opening in the base board. As shown, the terminal pin is provided with two spaced embossed portions 21 which project from one side of the terminal pin and a single embossed portion between these two which projects to the opposite side of the terminal pin. Alternatively, the terminal pin may be provided with a single embossed portion projecting only to one side.

Integrally formed with the head and depending therefrom is a pin member 30 of a relatively narrower width and longer length than the head portion. This pin member 30 is adapted to have attached thereto a wiring lead (not shown) such as by wrapping.

Figure 1:
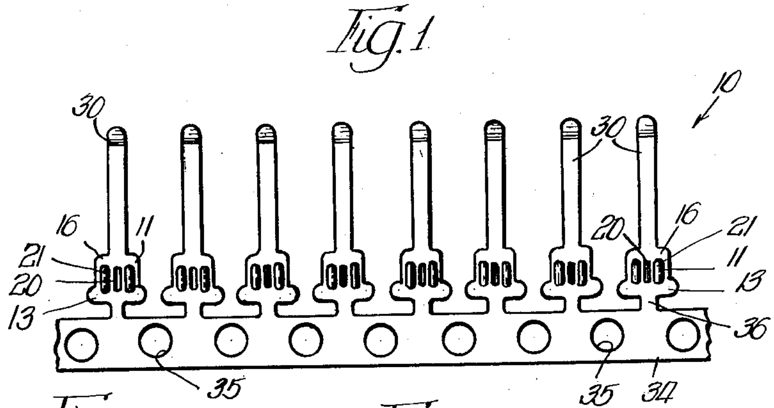
Figure 1 is a plan view of a chain with a number of terminal pins embodying the present invention mounted thereon.
Figure 2:
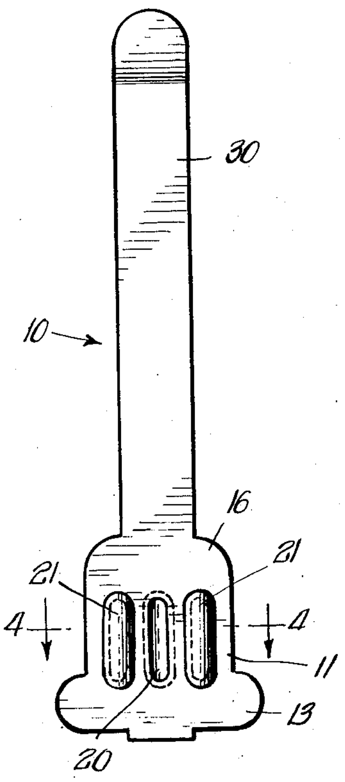
Figure 2 is a plan view greatly enlarged of a terminal pin embodying the invention separated from the chain.
Figure 3:
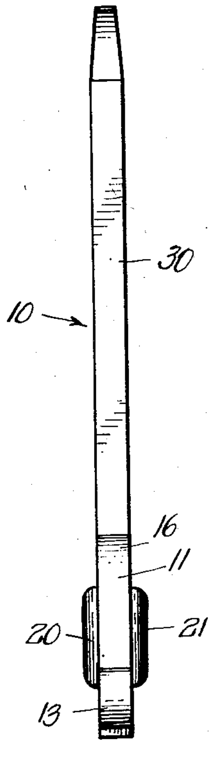
Figure 3 is a side view of the terminal pin shown in Figure 2.
Figure 4:
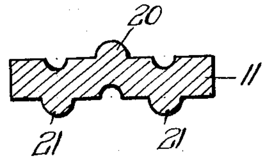
Figure 4 is a view in section taken substantially along line 4—4 of Figure 2.

As shown in Figure 1 the terminal pins of the invention may be mounted on a chain and in this manner fed to an automatic machine which automatically dispenses and sets them in the base board of a printed circuit. The chain is a strip of metal having a number of apertures 35 therein with a web 36 between the chain and the terminal pins. The terminal pins may be integrally formed with the chain and may be manufactured by stamping the complete unit from a single strip of metal.

Referring now to Figure 5 of the drawings there is shown a bose board 40 of a printed circuit 40' having an opening 41 therein. As shown, the terminal pin of the invention is mounted in the opening 41 of base board 40 with the flanges 13 engaging the top surface of the base board. After the terminal pin has been inserted the bottom portion 16' of the head is staked or split and spread at the ends as shown at 39 forming a pair of flanges for securely holding the pin in the base board by engaging the bottom surface of the base board.

In the drawing and specification there has been set forth a preferred embodiment of the invention, and although specific terms are employed, these are used in a generic and descriptive sense only, and not for purposes of limitation. Changes in form and the proportion of parts, as well as the substitution of equivalents are contemplated, as circumstances may suggest or render expedient, without departing from the spirit or scope of this invention as further defined in the following claims.

I claim:

1. An integrally formed terminal pin adapted to be mounted in openings in the base board of a printed circuit and the like, comprising an elongated flat head member of a width and length smaller than the openings and of a depth greater than the thickness of the base board, flange members at the top and projecting from the ends of said head member for engaging the surface contiguous to the opening on one side of the base board, said head member having a lower portion adapted to be split at the end margins thereof to form flange members for engaging the opposite side of the base board, at least one embossed portion on said head member projecting from the side thereof whereby the combined width of the head member and embossed portion is greater than the width of the opening for engaging and exerting a substantial pressure against the interior sides of the opening, and a relatively long pin member of rectangular cross section depending from said head member.

2. An integrally formed terminal pin according to claim 1 wherein the margins of the lower portion of said head member are provided with rounded shoulders to facilitate insertion into said opening.

3. In combination: a base board having elongated openings therein, an integrally formed terminal pin adapted to be mounted in said elongated openings, comprising an elongated flat head member of a width and length smaller than the openings and of a depth greater than the thickness of the base board, said head member having a portion extending below said base board adapted to be split at the end margins thereof to form flange members on one side of said base board, flange members at the top and projecting from the ends of said head member for engaging the opposite surface of the base board contiguous to the opening, at least one embossed portion on said head member projecting from the side thereof whereby the combined width of the head member and embossed portion is greater than the width of the opening engaging and exerting a substantial pressure against the interior sides of the openings, and a relatively long pin member of rectangular cross section depending from said head member.

4. A combination according to claim 3 wherein said end margins of said portion of said head member are provided with rounded shoulders to facilitate insertion of said terminal pin in the opening of said base board.

References Cited in the file of this patent

UNITED STATES PATENTS 2,163,779 Draving -------------- June 27, 1939